US007782577B2

(12) United States Patent
Raberg et al.

(10) Patent No.: US 7,782,577 B2
(45) Date of Patent: Aug. 24, 2010

(54) MRAM STRUCTURE USING SACRIFICIAL LAYER FOR ANTI-FERROMAGNET AND METHOD OF MANUFACTURE

(75) Inventors: Wolfgang Raberg, Fontainebleau (FR); Ulrich Klostermann, Fontainebleau (FR)

(73) Assignees: Infineon Technologies AG, Munich (DE); ALTIS Semiconductor, SNC, Corbeil Essonnes (FR)

( * ) Notice: Subject to any disclaimer, the term of this patent is extended or adjusted under 35 U.S.C. 154(b) by 929 days.

(21) Appl. No.: 11/448,170

(22) Filed: Jun. 6, 2006

(65) Prior Publication Data

US 2007/0278602 A1 Dec. 6, 2007

(51) Int. Cl.
G11B 5/127 (2006.01)
G11B 5/33 (2006.01)

(52) U.S. Cl. .............. 360/324.12; 360/314; 360/324; 360/324.1; 360/324.11; 360/327.22; 257/292; 257/295; 257/421; 257/489; 257/E29.323; 365/145; 365/171; 365/158; 365/222; 438/3

(58) Field of Classification Search .......... 257/292, 257/295, 421, 489, E29.323; 438/3; 360/113, 360/314, 324–324.12, 327.22, 327.32; 365/145, 365/171, 158, 222
See application file for complete search history.

(56) References Cited

U.S. PATENT DOCUMENTS

| 6,181,537 | B1* | 1/2001 | Gill | 360/324.2 |
|---|---|---|---|---|
| 7,486,551 | B1* | 2/2009 | Li et al. | 365/173 |
| 2001/0053053 | A1* | 12/2001 | Saito et al. | 360/324.11 |
| 2003/0053268 | A1* | 3/2003 | Lin et al. | 360/324.1 |
| 2003/0179515 | A1* | 9/2003 | Pinarbasi | 360/324.11 |
| 2003/0179518 | A1* | 9/2003 | Gill | 360/324.12 |
| 2003/0206379 | A1* | 11/2003 | Lin et al. | 360/319 |
| 2004/0061977 | A1* | 4/2004 | Freitag et al. | 360/314 |
| 2004/0136121 | A1* | 7/2004 | Mao et al. | 360/324.11 |
| 2004/0145850 | A1* | 7/2004 | Fukumoto et al. | 361/143 |
| 2005/0002132 | A1* | 1/2005 | Gill | 360/324.12 |
| 2005/0018362 | A1* | 1/2005 | Gill | 360/324.1 |
| 2005/0238924 | A1* | 10/2005 | Gill | 428/837 |
| 2005/0254287 | A1* | 11/2005 | Valet | 365/158 |
| 2005/0285168 | A1* | 12/2005 | Worledge et al. | 257/295 |
| 2006/0003185 | A1* | 1/2006 | Parkin | 428/692.1 |
| 2006/0017081 | A1* | 1/2006 | Sun et al. | 257/295 |
| 2006/0067016 | A1* | 3/2006 | Childress et al. | 360/324.12 |
| 2006/0180839 | A1* | 8/2006 | Fukumoto et al. | 257/295 |
| 2007/0139827 | A1* | 6/2007 | Gao et al. | 360/324.2 |

* cited by examiner

Primary Examiner—Lynne A Gurley
Assistant Examiner—Meiya Li

(57) ABSTRACT

A magnetic random access memory structure comprising an anti-ferromagnetic layer structure, a crystalline ferromagnetic structure physically coupled to the anti-ferromagnetic layer structure and a ferromagnetic free layer structure physically coupled to the crystalline ferromagnetic structure.

14 Claims, 2 Drawing Sheets

MRAM STRUCTURE USING SACRIFICIAL LAYER FOR ANTI-FERROMAGNET AND METHOD OF MANUFACTURE

TECHNICAL FIELD

The present invention relates to magnetic random access memory (MRAM) cells, and more particularly to MRAM cells employing anti-ferromagnetic layer structure for pinning, and methods of manufacture.

BACKGROUND

Magnetic random access memory (MRAM) devices are emerging as possible replacements for conventional RAM memory structures such as dynamic and static RAM structures. MRAM devices exhibit similar access speeds and greater immunity to radiation compared to conventional DRAM and SRAM structures, and advantageously do not require applied power to retain their logical state.

FIG. 1 illustrates a block diagram of a conventional MRAM device structure. The MRAM structure generally includes a "free" or storage layer 102, a reference layer 104, and a barrier junction 106 therebetween. The storage and reference layers 102 and 104 are formed from materials that possess a particular magnetic orientation, the relative orientations of which are either parallel, in which case the MRAM cell has a relatively low impedance between top and bottom electrodes 110a and 110b, or anti-parallel in which case the MRAM cell has a relatively high impedance between top and bottom electrodes 110a and 110b.

The storage layer 102 will typically consist of a material that has a lower magnetic coercivity, and can therefore more easily be re-oriented, compared to the reference layer 104. Reading the state of the MRAM cell is performed by passing a predefined current between the top and bottom electrodes 110a and 110b, and monitoring the resulting voltage (or vice versa). Programming can be performed using one of two conventional techniques. One programming technique is to apply word and bit line currents along a particular direction to a particular MRAM memory cell at the word and bit line intersection, the current applied at a sufficient magnitude to induce a change in the magnetization of the MRAM device. However, this approach requires the generation of high current drive levels, resulting in high power dissipation levels and the requirement of large gate periphery transistors to handle the peak current conditions.

Thermally-assisted programming represents another MRAM programming technique. In this approach, a heating current is supplied across the MRAM's barrier layer, the resistance of which causes the storage layer to heat to a predefined temperature. The storage layer is preferably constructed from a material that exhibits a decreasing magnetic coercivity with increasing temperature, such that when the storage layer is sufficiently heated, lower magnitude writing currents can be used to re-orient the existing magnetic polarization of the storage layer.

Re-orientation with even lower magnitude writing currents can be achieved by using a storage layer combined with an anti-ferromagnetic layer. In such a structure the anti-ferromagnetic layer is pinning the existing magnetic polarization of the storage layer as long as the anti-ferromagnetic layer is kept below its blocking temperature. Since magnetic coercivity of the storage layer itself can be lower, writing currents can be lower, too. But re-orientation of the existing magnetic polarization of the storage layer will usually only work if the anti-ferromagnetic layer is heated up above its blocking temperature, therewith becoming inactive.

Unfortunately, materials having best physical attitudes for being used as anti-ferromagnetic layer and materials having best physical attitudes for being used as storage layer or reference layer do not necessarily show expected attitudes when in contact to each other. They may, for example, show unexpected low pinning forces.

What is therefore needed is an MRAM structure with an anti-ferromagnetic layer overcoming above-mentioned drawbacks.

SUMMARY OF THE INVENTION

Aspects of the present invention provide an MRAM structure that allows the combination of materials best suited for being used as ferromagnetic layer (storage/reference layer) and anti-ferromagnetic layer, respectively. Therewith providing a MRAM structure, which among others, enables device programming at low current levels. Low programming current permits the implementation of smaller current handling transistors, and accordingly higher density MRAM memory devices and arrays.

In one representative embodiment of the invention, the MRAM structure comprises an anti-ferromagnetic layer structure, a crystalline ferromagnetic structure physically coupled to the anti-ferromagnetic layer structure and a ferromagnetic layer structure physically coupled to the crystalline ferromagnetic structure.

These and other features of the invention will be better understood in view of the following drawings and detailed description.

BRIEF DESCRIPTION OF THE DRAWINGS

For a more complete understanding of the present invention, and the advantages thereof, reference is now made to the following descriptions taken in conjunction with the accompanying drawing, in which.

For clarity, previously identified features retain their reference indicia in subsequent drawings.

DETAILED DESCRIPTION OF ILLUSTRATIVE EMBODIMENTS

Figure 1:
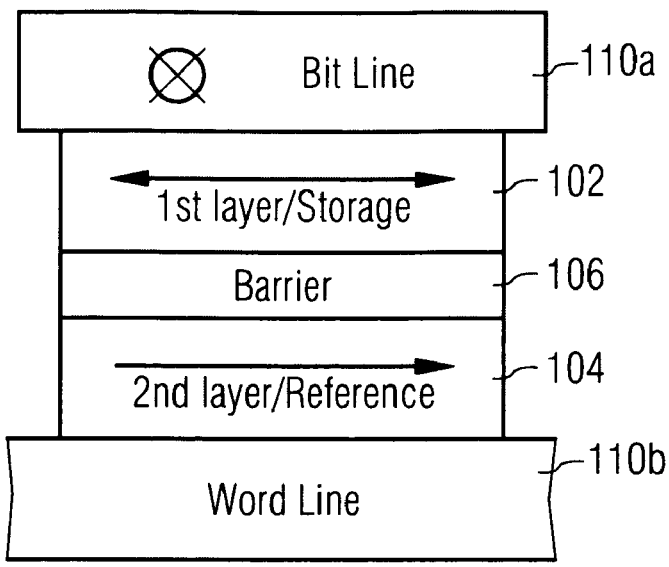
FIG. 1 illustrates a conventional MRAM device structure.
Figure 2:
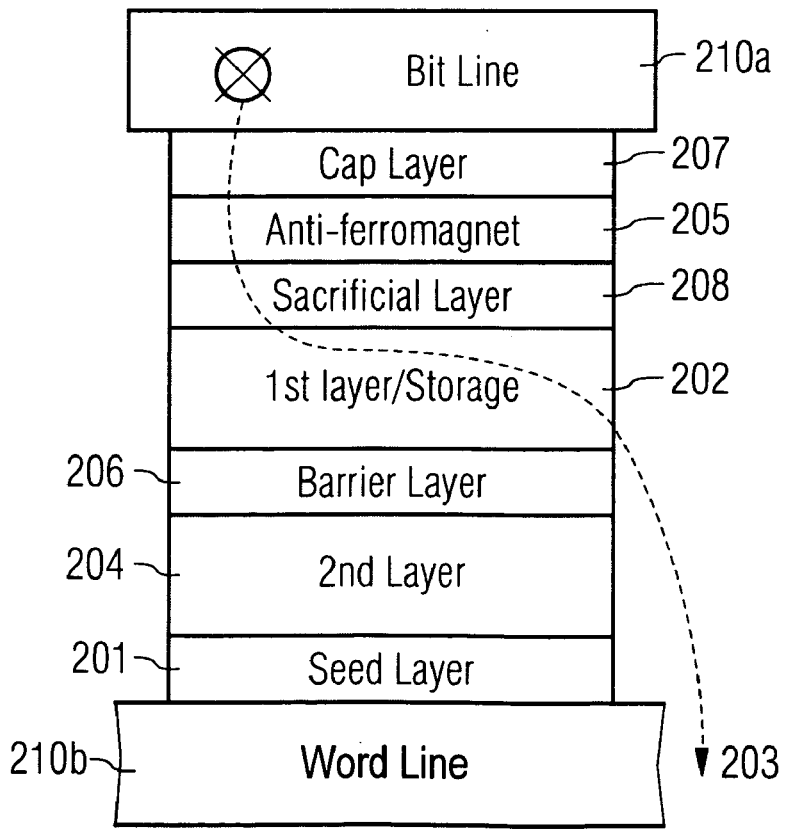
FIG. 2 illustrates an exemplary MRAM device structure in accordance with the present invention.

FIG. 2 illustrates an exemplary MRAM device structure 200 in accordance with the present invention. Basically, the exemplary MRAM device structure 200 includes a first layer 202, a second layer 204, and a barrier layer 206 disposed between the first and second layers 202 and 204. In an exemplary embodiment, which provides applicability for thermally supported programming, the conventional MRAM device structure 200 further includes an anti-ferromagnetic layer 205 accompanying the first layer 202. A sacrificial layer 208 is disposed between the first layer 202 and the anti-ferromagnetic layer 205.

The exemplary MRAM device structure 200 further includes a cap layer 207 for protection and enforced pinning capability on top of the anti-ferromagnetic layer 205, and a seed layer 201 representing a carrier layer for manufacture at the bottom of the second layer 204.

A current path 203 is provided through cap layer 207, the anti-ferromagnetic layer 205, the sacrificial layer 208, the first layer 202, the barrier layer 206, the second layer 204 and through the seed layer 201. The current path 203 being operable, for example, in conducting read current for determining the binary state stored in the MRAM device structure 200.

In an exemplary embodiment, the first layer 202 is operable to receive MRAM device current through the cap layer 207, the anti-ferromagnetic layer 205 and the sacrificial layer 208. The first layer 202 is composed of at least one storage layer, which is also called free layer or data layer, having a magnetic polarization that can be altered in the presence of a magnetic field, e.g., generated by a write current.

In such an embodiment, the storage layer may be composed of ferromagnetic materials and further preferably, those materials that provide proper magneto resistance (MR) response. The storage layer therewith exhibits a high coercivity with an accompanying anti-ferromagnet being active, i.e., below its blocking temperature, e.g., at room temperature, and a relatively low coercivity with the accompanying anti-ferromagnet being inactive, i.e., above its blocking temperature. Heating up of the anti-ferromagnetic layer 205, by the way, can be caused by a write current through the barrier layer 206, by an additional heating layer, by other heating means or a combination of these.

The ferromagnetic material of the storage layer in an exemplary embodiment is an amorphous layer structure. The ferromagnetic material includes elements from the group consisting of cobalt Co, iron Fe, boron B, nickel Ni, e.g., nickel iron boron NiFeB, and preferably cobalt iron boron CoFeB, which provides excellent magneto resistance (MR) response. But the ferromagnetic material is not limited to an amorphous type; it can also be of a crystalline type or a polycrystalline type. In an exemplary embodiment the storage layer has a thickness between 10 to 200 Angstrom, for example a thickness between 20 to 50 Angstrom.

The anti-ferromagnetic layer 205 in an exemplary embodiment is made of materials including elements selected from the group consisting of iridium Ir, manganese Mn, platinum Pt, rhodium Rh, palladium Pd, iron Fe, nickel Ni, e.g., nickel manganese NiMn, iron manganese FeMn, nickel iron manganese NiFeMn, and, for example, iridium manganese IrMn. In an exemplary embodiment, the anti-ferromagnetic layer 207 has a thickness between 20 to 150 Angstrom, for example a thickness between 30 to 80 Angstrom.

The sacrificial layer 208 is composed of crystalline ferromagnetic materials, for example of those materials that allow a good exchange coupling to anti-ferromagnetic materials. In an exemplary embodiment the crystalline ferromagnetic material includes nickel iron NiFe, but it can also be of other compositions, e.g., cobalt iron CoFe or any composition based on nickel Ni, e.g., nickel iron cobalt NiFeCo (if the storage layer is not of the same type). In an exemplary embodiment the sacrificial layer 208 has a thickness between 5 to 100 Angstrom, for example, a thickness between 10 to 50 Angstrom.

The second layer 204 represents the layer from which current exits the MRAM device structure 200 via the seed layer 201, and in a particular embodiment is the second layer 204 is composed of at least one reference layer operable to provide a set magnetic polarization. In a further embodiment, the second layer 204 may have an accompanying anti-ferromagnetic layer based on the seed layer 201, and in another embodiment a sacrificial layer may be disposed between the second layer 204 and its accompanying anti-ferromagnetic layer.

Of course, current may be supplied to the MRAM device structure initially through another type of layer, for example, a reference layer. In such instances, that layer would include the first layer, and the foregoing composition would be replaced by a composition commensurate with the function of that particular layer-type.

A reference layer may be composed of ferromagnetic materials NiFe, CoFe, CoFeB, NiFeB, Fe, CoFeNi, NiFeN, CoFeN, and antiparallely pinned systems containing eg Ru or Ir as coupling layers (commonly called synthetic antiferromagnets), and, for example, those materials that provide high magneto resistance response and high coercivity. With an accompanying anti-ferromagnetic layer high coercivity of the reference layer may be achieved by pinning to the anti-ferromagnet.

In an alternative embodiment, the second layer 204 includes another layer (e.g., the storage layer) through which current exits the MRAM device, and in such cases, the layer is composed of materials commensurate with the function of that layer.

The barrier layer 206, which is of non-magnetic material and may be composed of more than one layer, is disposed between the first and second layers 202 and 204, and in a particular embodiment is a magnetic tunneling junction (MTJ) of the MRAM device structure 200. Exemplary compositions of the barrier layer 206 include MgO, AlN, aluminium oxide for example. In the particular embodiment as shown, the top electrode 210a has a longitudinal plan into and out of the drawing, and the bottom electrode 210b has a longitudinal plan in the plan of the drawing, although other orientations may be employed in alternative embodiments of the invention.

Figure 3A:
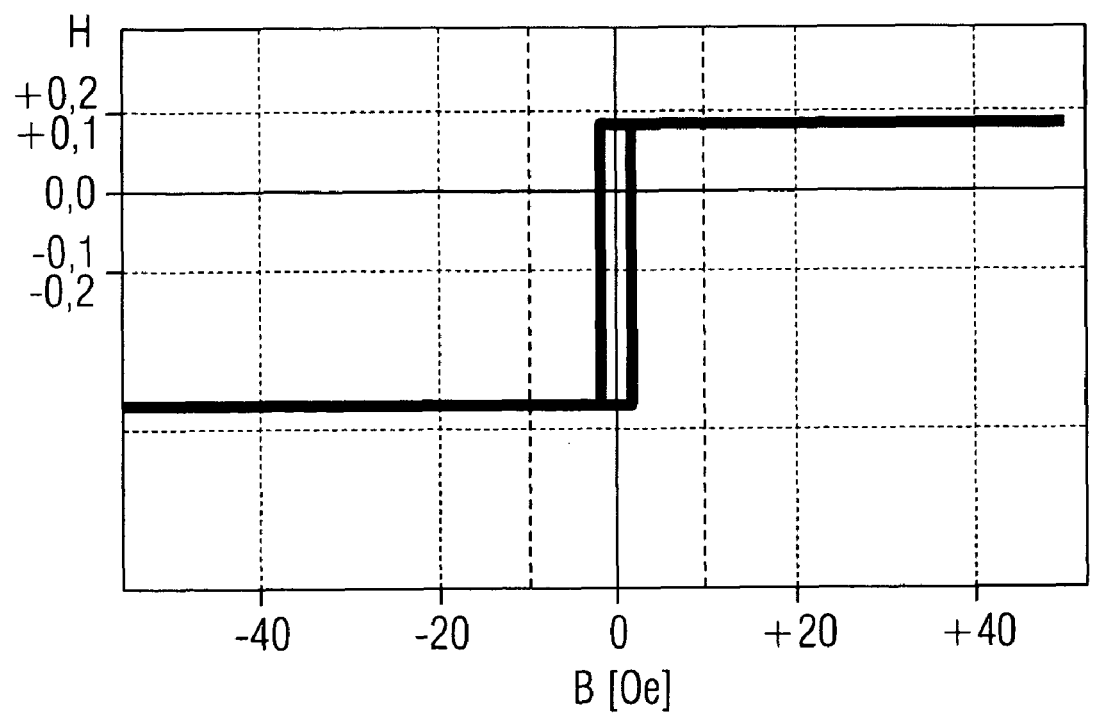
FIG. 3A illustrates exemplary a magnetization loop for a storage layer physically coupled to an anti-ferromagnetic layer.
Figure 3B:
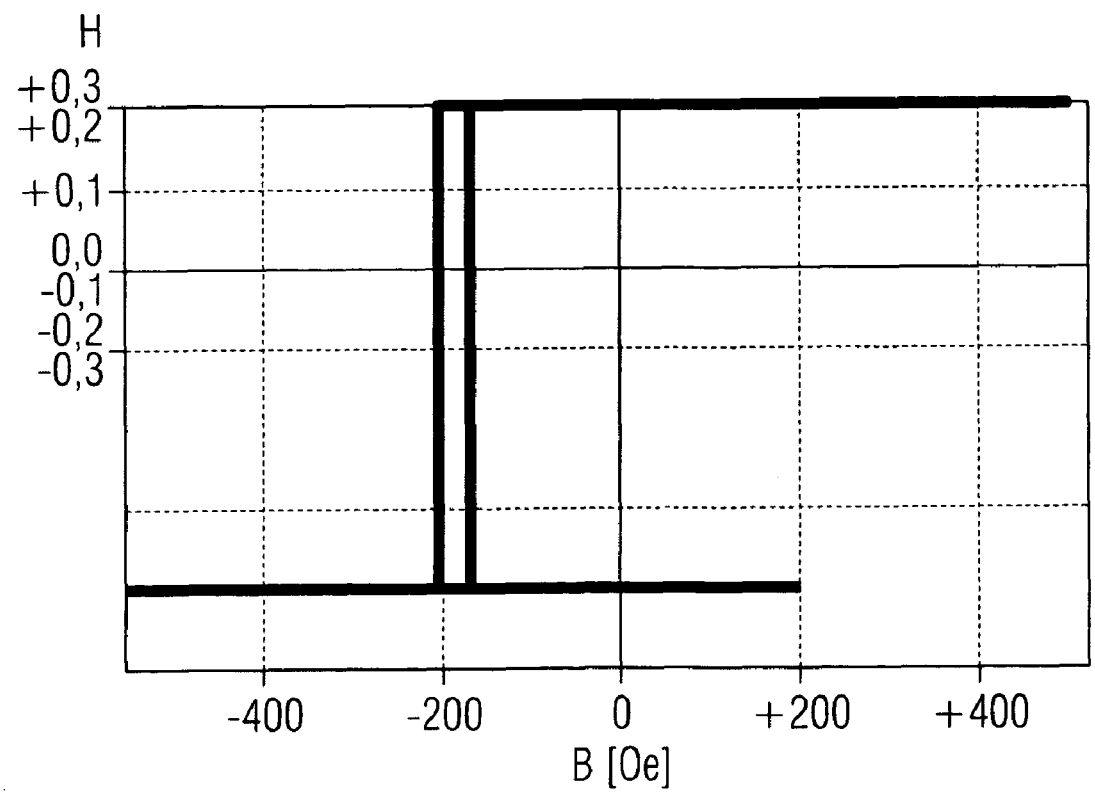
FIG. 3B illustrates exemplary a magnetization loop for a storage layer of a MRAM device structure in accordance with the present invention.

FIG. 3A and FIG. 3B illustrate exemplary magnetization loops for a storage layer in an MRAM device with the storage layer having an accompanied anti-ferromagnetic layer for pinning. FIG. 3A refers to a layer system having the storage layer physically located next to the anti-ferromagnetic layer without exchange coupling occurring. FIG. 3B, in comparison thereto, refers to a layer system in accordance with an embodiment of the present invention that, in an exemplary embodiment, uses a sacrificial layer composed of a crystalline ferromagnetic structure, e.g., of nickel NiFe, and with an exemplary thickness of 10 Angstrom, disposed between the storage layer and the anti-ferromagnetic layer.

In both above-mentioned exemplary layer systems, the storage layer is composed of the ferromagnetic material CoFeB with a thickness of 30 Angstrom and the accompanied anti-ferromagnetic layer being composed of IrMn with a thickness of 100 Angstrom in the conventional layer system and 60 Angstrom in the layer system composed in accordance with the present invention. Both magnetization loops illustrate the Magnetic field H (horizontal axis) versus the Magnetic moment B (vertical axis) measurable in the frame of a change of polarization in the storage layer at room temperature (the resistance R of the element could be plotted instead of B).

As the magnetization loop in FIG. 3A shows, starting from a first polarization direction having an exemplary Magnetic moment B (which depends on the thickness, size, shape and material used for the MRAM device) this value and therewith the first polarization direction will be stable with a Magnetic Field H applied to the storage layer, e.g., by the magnetic field H generated by a current through a conductor, has a direction that is supporting the first polarization direction. This direction of the magnetic field H is represented by negative values of H in the shown example.

Accordingly, a Magnetic field H having positive values works against the first polarization direction and a change of the magnetization direction into a second magnetization direction takes place when the magnetic field H reaches the value of the coercivity $H_c$ of the freelayer device (typically in the order of 2-200 Oe). In an analog way a change back to the first polarization direction will take place when the magnetic field H becomes negative and reaches $-H_c$.

The low values of 2.5 Oersted in case of a sheet film show that the magnetic polarization can be altered by a very weak Magnetic field H, revealing very low pinning effect of the storage layer to the accompanying anti-ferromagnet.

In case of the presence of antiferromagnetic coupling (exchange coupling) via the sacrificial layer, the hysteresis loop is shifted to large values compared to $H_c$ (e.g., 200 Oe). The orientation of the free layer can only be altered by applying an external field larger than this shift and will affect the read value only if this external field is sustained during the read operation. Writing is performed by heating the anti-ferromagnet above the blocking temperature (for IrMn in the range of 100 to 300° C.) which disables the exchange coupling resulting in condition similar to FIG. 3A. Application of a magnetic field to switch the unbiased free layer as described above and subsequent cool down of the anti-ferromagnet leads to a shifted hysteris curve in the other direction.

Since the magnetization loop of FIG. 3B refers to the same materials for the storage layer and anti-ferromagnetic layer as FIG. 3A does, the reason of the difference in pinning forces has to be seen in the sacrificial layer.

An explanation for the low pinning forces of a layer system on which the magnetization loop of FIG. 3A refers to, can be seen in the poor growth of an anti-ferromagnet, e.g., IrMn, on a surface of a ferromagnet, e.g., CoFeB, during manufacturing. The poor growth leads to a poor texture of the anti-ferromagnet, which in turn leads to the poor pinning forces of a ferromagnet to an anti-ferromagnet, which is grown on the surface of the ferromagnet.

An explanation in contrast for the relatively high pinning forces of a layer system, which the magnetization loop of FIG. 3B refers to, can be seen in the good growth of an anti-ferromagnet, e.g., IrMn, on a crystalline ferromagnetic material, e.g., NiFe, used for the sacrificial layer. The crystalline ferromagnetic material with its crystalline structure induces this structure into the growing anti-ferromagnet during manufacturing therewith the crystalline structure of the crystalline ferromagnetic material sets 'direction of growth' for the anti-ferromagnetic material. In other words the crystalline structure of the crystalline ferromagnetic material dominates into the anti-ferromagnet, which causes good growth and therewith good texture of the anti-ferromagnetic material, which in turn leads to high pinning forces.

Good growth of the crystalline ferromagnetic material on ferromagnetic material among others can be ensured when ferromagnetic layer structure and crystalline ferromagnetic structure are substantially matched to one another with regard to their crystal structure.

The material used for sacrificial layer may have a less advantageous magneto-resistance response than the ferromagnetic material used for the storage layer, but in manufacturing, during anneal at an exemplary range between 230 to 280° C. for a couple of hours the crystalline ferromagnetic material, e.g., NiFe, used for the sacrificial layer will be partly converted into anti-ferromagnetic material, e.g., NiFeMn. In general it can be observed that NiFe becomes nonmagnetic when in tight physical contact to an Mn combination like IrMn, NiMn or FeMn. This is presumably due to a migration of Mn from the anti-ferromagnetic material, e.g., IrMn, into the material of the sacrificial layer. This explains the 'sacrificial' function of the sacrificial layer, which also could be considered as a seed layer for the accompanying anti-ferromagnet.

In an exemplary read operation, a predefined voltage is applied across the interface contacts 210a and 210b, and a current, which is ordinarily lower than the writing current, is produced thereby, the resulting current indicative of the cell's resistive state as being either higher (logical 1) or lower (logical 0) than a predefined resistance.

An exemplary method of manufacturing the MRAM device in accordance with the present invention can be briefly described in reference to FIG. 2. Initially, on a seed layer 201 a ferromagnetic reference layer as a second layer 204 is formed, on top of that, one after the other a barrier layer 206, a ferromagnetic storage layer as a first layer 202, a sacrificial layer 208, an anti-ferromagnetic layer 205, and a cap layer 207 is formed. The barrier layer 206 in a particular embodiment is a magnetic tunneling junction (MTJ) of the MRAM device.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A magnetic random access memory structure, comprising:
    an anti-ferromagnetic layer structure;
    a crystalline ferromagnetic structure physically coupled to the anti-ferromagnetic layer structure; and
    a ferromagnetic free layer structure physically coupled and adjacent to the crystalline ferromagnetic structure.

2. The magnetic random access memory structure of claim 1, further comprising:
    a non-magnetic barrier layer physically coupled to the ferromagnetic free layer structure; and
    a magnetic reference layer structure physically coupled to the non-magnetic barrier layer.

3. The magnetic random access memory structure of claim 1, wherein the ferromagnetic free layer structure and the crystalline ferromagnetic structure are substantially matched to one another with regard to their crystal structure.

4. The magnetic random access memory structure of claim 1, wherein the ferromagnetic free layer structure comprises an amorphous layer structure.

5. The magnetic random access memory structure of claim 1, wherein the ferromagnetic free layer structure comprises a crystalline or polycrystalline layer structure.

6. The magnetic random access memory structure of claim 1, wherein the ferromagnetic free layer structure has a thickness in the range between 10 Angstrom to 200 Angstrom.

7. The magnetic random access memory structure of claim 1, wherein the ferromagnetic free layer structure is made of a material comprising elements selected from the group consisting of cobalt, iron, boron and nickel.

8. The magnetic random access memory structure of claim 7, wherein the ferromagnetic free layer structure comprises cobalt iron boron or nickel iron boron.

9. The magnetic random access memory structure of claim 1, wherein the crystalline ferromagnetic structure has a thickness in the range between 5 Angstrom to 100 Angstrom.

10. The magnetic random access memory structure of claim 1, wherein the crystalline ferromagnetic structure comprises nickel iron.

11. The magnetic random access memory structure of claim 1, wherein the anti-ferromagnetic layer structure has a thickness in the range between 20 Angstrom to 150 Angstrom.

12. The magnetic random access memory structure of claim 1, wherein the anti-ferromagnetic layer structure comprises a material comprising elements selected from the group consisting of iridium, manganese, iron and nickel.

13. The magnetic random access memory structure of claim 12, wherein the anti-ferromagnetic layer structure comprises iridium manganese, nickel manganese, iron manganese or nickel iron manganese.

14. A magnetic random access memory structure, comprising:
- an anti-ferromagnetic layer structure;
- a crystalline ferromagnetic structure physically coupled to the anti-ferromagnetic layer structure;
- a ferromagnetic free layer structure physically coupled and adjacent to the crystalline ferromagnetic structure;
- a non-magnetic barrier layer physically coupled to the ferromagnetic free layer structure; and
- a magnetic reference layer structure physically coupled to the non-magnetic barrier layer,
- wherein the ferromagnetic free layer structure and the crystalline ferromagnetic structure are substantially matched to one another with regard to their crystal structure.

* * * * *